(12) United States Patent
Levy et al.

(10) Patent No.: US 8,643,124 B2
(45) Date of Patent: Feb. 4, 2014

(54) OXIDE-NITRIDE-OXIDE STACK HAVING MULTIPLE OXYNITRIDE LAYERS

(75) Inventors: Sagy Levy, Zichron-Yoakev (IL); Krishnaswamy Ramkumar, San Jose, CA (US); Fredrick Jenne, Los Gatos, CA (US); Sam Geha, Cupertino, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/007,533

(22) Filed: Jan. 14, 2011

(65) Prior Publication Data

US 2011/0248332 A1 Oct. 13, 2011

Related U.S. Application Data

(63) Continuation-in-part of application No. 11/811,958, filed on Jun. 13, 2007.

(60) Provisional application No. 60/931,947, filed on May 25, 2007.

(51) Int. Cl.
*H01L 21/336* (2006.01)

(52) U.S. Cl.
USPC ........... 257/411; 257/365; 257/639; 257/298; 257/E21.267

(58) Field of Classification Search
None
See application file for complete search history.

(56) References Cited

U.S. PATENT DOCUMENTS

| | | |
|---|---|---|
| 4,395,438 A | 7/1983 | Chiang |
| 4,490,900 A | 1/1985 | Chiu |
| 4,543,707 A | 10/1985 | Ito et al. |
| 4,843,023 A | 6/1989 | Chiu et al. |
| 4,870,470 A | 9/1989 | Bass et al. |
| 5,404,791 A | 4/1995 | Ahmad et al. |
| 5,408,115 A | 4/1995 | Chang |
| 5,464,783 A | 11/1995 | Kim et al. |
| 5,573,963 A | 11/1996 | Sung |
| 5,793,089 A | 8/1998 | Fulford et al. |
| 5,817,170 A | 10/1998 | Desu et al. |
| 5,861,347 A | 1/1999 | Maiti et al. |
| 5,937,323 A | 8/1999 | Orczyk et al. |

(Continued)

FOREIGN PATENT DOCUMENTS

WO 2011162725 A 12/2011

OTHER PUBLICATIONS

USPTO Non-Final Rejection for U.S. Appl. No. 11/811,958 dated Oct. 7, 2010; 12 pages.

(Continued)

*Primary Examiner* — Shouxiang Hu
*Assistant Examiner* — Mohammad Choudhry

(57) ABSTRACT

A semiconductor device including a silicon-oxide-oxynitride-oxide-silicon structure and methods of forming the same are provided. Generally, the structure comprises: a tunnel oxide layer on a surface of a substrate including silicon; a multi-layer charge storing layer including an oxygen-rich, first oxynitride layer on the tunnel oxide layer in which the stoichiometric composition of the first oxynitride layer results in it being substantially trap free, and an oxygen-lean, second oxynitride layer on the first oxynitride layer in which the stoichiometric composition of the second oxynitride layer results in it being trap dense; a blocking oxide layer on the second oxynitride layer; and a silicon containing gate layer on the blocking oxide layer. Other embodiments are also disclosed.

18 Claims, 6 Drawing Sheets

(56) References Cited

U.S. PATENT DOCUMENTS

| | | |
|---|---|---|
| 5,939,333 A | 8/1999 | Hurley et al. |
| 5,972,765 A | 10/1999 | Clark et al. |
| 5,972,804 A | 10/1999 | Tobin et al. |
| 6,015,739 A | 1/2000 | Gardner et al. |
| 6,020,606 A | 2/2000 | Liao |
| 6,023,093 A | 2/2000 | Gregor et al. |
| 6,025,267 A | 2/2000 | Pey et al. |
| 6,074,915 A | 6/2000 | Chen et al. |
| 6,114,734 A | 9/2000 | Eklund |
| 6,127,227 A | 10/2000 | Lin et al. |
| 6,140,187 A | 10/2000 | DeBusk et al. |
| 6,147,014 A | 11/2000 | Lyding et al. |
| 6,150,286 A | 11/2000 | Sun et al. |
| 6,157,426 A | 12/2000 | Gu |
| 6,162,700 A | 12/2000 | Hwang et al. |
| 6,174,774 B1 | 1/2001 | Lee |
| 6,214,689 B1 | 4/2001 | Lim et al. |
| 6,217,658 B1 | 4/2001 | Orczyk et al. |
| 6,218,700 B1 | 4/2001 | Papadas |
| 6,268,299 B1 | 7/2001 | Jammy et al. |
| 6,277,683 B1 | 8/2001 | Pradeep et al. |
| 6,297,096 B1 | 10/2001 | Boaz |
| 6,297,173 B1 | 10/2001 | Tobin et al. |
| 6,321,134 B1 | 11/2001 | Henley et al. |
| 6,335,288 B1 | 1/2002 | Kwan et al. |
| 6,348,380 B1 | 2/2002 | Weimer et al. |
| 6,365,518 B1 | 4/2002 | Lee et al. |
| 6,399,484 B1 | 6/2002 | Yamasaki et al. |
| 6,406,960 B1 | 6/2002 | Hopper et al. |
| 6,429,081 B1 | 8/2002 | Doong et al. |
| 6,433,383 B1 * | 8/2002 | Ramsbey et al. ............ 257/315 |
| 6,440,797 B1 | 8/2002 | Wu et al. |
| 6,444,521 B1 | 9/2002 | Chang et al. |
| 6,445,030 B1 | 9/2002 | Wu et al. |
| 6,468,927 B1 | 10/2002 | Zhang et al. |
| 6,518,113 B1 | 2/2003 | Buynoski |
| 6,559,026 B1 | 5/2003 | Rossman et al. |
| 6,586,343 B1 | 7/2003 | Ho et al. |
| 6,586,349 B1 | 7/2003 | Jeon et al. |
| 6,599,795 B2 | 7/2003 | Ogata |
| 6,602,771 B2 | 8/2003 | Inoue et al. |
| 6,610,614 B2 | 8/2003 | Niimi et al. |
| 6,661,065 B2 | 12/2003 | Kunikiyo |
| 6,670,241 B1 | 12/2003 | Kamal et al. |
| 6,677,213 B1 | 1/2004 | Ramkumar et al. |
| 6,709,928 B1 | 3/2004 | Jenne et al. |
| 6,713,127 B2 | 3/2004 | Subramony et al. |
| 6,730,566 B2 | 5/2004 | Niimi et al. |
| 6,746,968 B1 | 6/2004 | Tseng et al. |
| 6,768,160 B1 | 7/2004 | Li et al. |
| 6,768,856 B2 | 7/2004 | Akwani et al. |
| 6,774,433 B2 | 8/2004 | Lee et al. |
| 6,787,419 B2 | 9/2004 | Chen et al. |
| 6,818,558 B1 | 11/2004 | Rathor et al. |
| 6,833,582 B2 | 12/2004 | Mine et al. |
| 6,835,621 B2 | 12/2004 | Yoo et al. |
| 6,884,681 B1 | 4/2005 | Kamal et al. |
| 6,903,422 B2 | 6/2005 | Goda et al. |
| 6,906,390 B2 | 6/2005 | Nomoto et al. |
| 6,913,961 B2 | 7/2005 | Hwang |
| 6,946,349 B1 | 9/2005 | Lee et al. |
| 6,958,511 B1 | 10/2005 | Halliyal et al. |
| 7,012,299 B2 | 3/2006 | Mahajani et al. |
| 7,015,100 B1 | 3/2006 | Lee et al. |
| 7,018,868 B1 | 3/2006 | Yang et al. |
| 7,033,890 B2 | 4/2006 | Shone |
| 7,033,957 B1 | 4/2006 | Shiraiwa et al. |
| 7,042,054 B1 | 5/2006 | Ramkumar et al. |
| 7,045,424 B2 | 5/2006 | Kim et al. |
| 7,098,154 B2 | 8/2006 | Yoneda |
| 7,112,486 B2 | 9/2006 | Cho et al. |
| 7,115,469 B1 | 10/2006 | Halliyal et al. |
| 7,172,940 B1 | 2/2007 | Chen et al. |
| 7,238,990 B2 | 7/2007 | Burnett et al. |
| 7,250,654 B2 | 7/2007 | Chen et al. |
| 7,253,046 B2 | 8/2007 | Higashi et al. |
| 7,262,457 B2 | 8/2007 | Hsu et al. |
| 7,315,474 B2 | 1/2008 | Lue |
| 7,365,389 B1 | 4/2008 | Jeon et al. |
| 7,372,113 B2 | 5/2008 | Tanaka et al. |
| 7,390,718 B2 | 6/2008 | Roizin et al. |
| 7,410,857 B2 | 8/2008 | Higashi et al. |
| 7,450,423 B2 | 11/2008 | Lai et al. |
| 7,463,530 B2 | 12/2008 | Lue et al. |
| 7,479,425 B2 | 1/2009 | Ang et al. |
| 7,482,236 B2 | 1/2009 | Lee et al. |
| 7,544,565 B2 | 6/2009 | Kwak et al. |
| 7,576,386 B2 | 8/2009 | Lue et al. |
| 7,588,986 B2 | 9/2009 | Jung |
| 7,612,403 B2 | 11/2009 | Bhattacharyya |
| 7,636,257 B2 | 12/2009 | Lue |
| 7,646,637 B2 | 1/2010 | Liao |
| 7,670,963 B2 | 3/2010 | Ramkumar et al. |
| 7,714,379 B2 | 5/2010 | Lee |
| 7,723,789 B2 | 5/2010 | Lin et al. |
| 7,879,738 B2 | 2/2011 | Wang |
| 7,910,429 B2 | 3/2011 | Dong et al. |
| 7,999,295 B2 | 8/2011 | Lai et al. |
| 8,008,713 B2 | 8/2011 | Dobuzinsky et al. |
| 8,063,434 B1 | 11/2011 | Polishchuk et al. |
| 8,067,284 B1 | 11/2011 | Levy |
| 8,093,128 B2 | 1/2012 | Koutny, Jr. et al. |
| 8,143,129 B2 | 3/2012 | Ramkumar et al. |
| 8,222,688 B1 | 7/2012 | Jenne et al. |
| 8,318,608 B2 | 11/2012 | Ramkumar et al. |
| 2001/0052615 A1 | 12/2001 | Fujiwara |
| 2002/0020890 A1 | 2/2002 | Willer |
| 2002/0154878 A1 | 10/2002 | Akwani et al. |
| 2003/0122204 A1 | 7/2003 | Nomoto et al. |
| 2003/0123307 A1 | 7/2003 | Lee et al. |
| 2003/0124873 A1 | 7/2003 | Xing et al. |
| 2003/0183869 A1 | 10/2003 | Crivelli et al. |
| 2003/0227049 A1 | 12/2003 | Sakakibara |
| 2004/0067619 A1 | 4/2004 | Niimi et al. |
| 2004/0071030 A1 | 4/2004 | Goda et al. |
| 2004/0094793 A1 | 5/2004 | Noguchi et al. |
| 2004/0104424 A1 | 6/2004 | Yamazaki |
| 2004/0129986 A1 | 7/2004 | Kobayashi et al. |
| 2004/0173918 A1 | 9/2004 | Kamal et al. |
| 2004/0183122 A1 | 9/2004 | Mine et al. |
| 2004/0207002 A1 | 10/2004 | Ryu et al. |
| 2004/0227196 A1 | 11/2004 | Yoneda |
| 2004/0251489 A1 | 12/2004 | Jeon et al. |
| 2005/0026637 A1 | 2/2005 | Fischer et al. |
| 2005/0070126 A1 | 3/2005 | Senzaki |
| 2005/0093054 A1 | 5/2005 | Jung |
| 2005/0098839 A1 | 5/2005 | Lee et al. |
| 2005/0141168 A1 | 6/2005 | Lee et al. |
| 2005/0186741 A1 | 8/2005 | Roizin et al. |
| 2005/0205920 A1 | 9/2005 | Jeon et al. |
| 2005/0224866 A1 | 10/2005 | Higashi et al. |
| 2005/0236679 A1 * | 10/2005 | Hori et al. .................... 257/411 |
| 2005/0245034 A1 | 11/2005 | Fukuda et al. |
| 2005/0266637 A1 | 12/2005 | Wang |
| 2005/0275010 A1 | 12/2005 | Chen et al. |
| 2005/0275012 A1 | 12/2005 | Nara et al. |
| 2006/0017092 A1 | 1/2006 | Dong et al. |
| 2006/0051880 A1 | 3/2006 | Doczy et al. |
| 2006/0065919 A1 | 3/2006 | Fujiwara |
| 2006/0111805 A1 | 5/2006 | Yokoyama et al. |
| 2006/0113586 A1 | 6/2006 | Wang |
| 2006/0113627 A1 | 6/2006 | Chen et al. |
| 2006/0160303 A1 | 7/2006 | Ang et al. |
| 2006/0192248 A1 | 8/2006 | Wang |
| 2006/0202263 A1 | 9/2006 | Lee |
| 2006/0220106 A1 | 10/2006 | Choi et al. |
| 2006/0226490 A1 | 10/2006 | Burnett et al. |
| 2006/0228899 A1 | 10/2006 | Nansei et al. |
| 2006/0261401 A1 * | 11/2006 | Bhattacharyya ............ 257/316 |
| 2006/0281331 A1 | 12/2006 | Wang |
| 2007/0029625 A1 | 2/2007 | Lue et al. |
| 2007/0031999 A1 | 2/2007 | Ho et al. |
| 2007/0048916 A1 | 3/2007 | Suzuki et al. |
| 2007/0049048 A1 | 3/2007 | Rauf et al. |

(56) References Cited

U.S. PATENT DOCUMENTS

| | | | |
|---|---|---|---|
| 2007/0051306 A1 | 3/2007 | Ivanov et al. | |
| 2007/0066087 A1 | 3/2007 | Jung | |
| 2007/0121380 A1* | 5/2007 | Thomas | 365/185.17 |
| 2007/0210371 A1 | 9/2007 | Hisamoto et al. | |
| 2007/0272971 A1 | 11/2007 | Lee et al. | |
| 2008/0029399 A1 | 2/2008 | Tomita et al. | |
| 2008/0048237 A1 | 2/2008 | Iwata | |
| 2008/0057644 A1 | 3/2008 | Kwak et al. | |
| 2008/0087942 A1 | 4/2008 | Hsu et al. | |
| 2008/0146042 A1 | 6/2008 | Kostamo et al. | |
| 2008/0150003 A1 | 6/2008 | Chen et al. | |
| 2008/0237694 A1 | 10/2008 | Specht et al. | |
| 2008/0258203 A1 | 10/2008 | Happ et al. | |
| 2008/0272424 A1 | 11/2008 | Kim et al. | |
| 2008/0286927 A1 | 11/2008 | Kim et al. | |
| 2008/0290398 A1 | 11/2008 | Polishchuk et al. | |
| 2008/0290399 A1 | 11/2008 | Levy et al. | |
| 2008/0290400 A1 | 11/2008 | Jenne et al. | |
| 2008/0293207 A1 | 11/2008 | Koutny, Jr. et al. | |
| 2008/0293255 A1 | 11/2008 | Ramkumar | |
| 2008/0296664 A1 | 12/2008 | Ramkumar et al. | |
| 2009/0011609 A1 | 1/2009 | Ramkumar et al. | |
| 2009/0039414 A1 | 2/2009 | Lue et al. | |
| 2009/0179253 A1 | 7/2009 | Levy | |
| 2009/0302365 A1 | 12/2009 | Bhattacharyya | |
| 2010/0252877 A1 | 10/2010 | Nakanishi et al. | |
| 2011/0237060 A1 | 9/2011 | Lee et al. | |
| 2011/0248332 A1 | 10/2011 | Levy et al. | |

OTHER PUBLICATIONS

USPTO Advisory Action for U.S. Appl. No. 11/811,958 dated Apr. 20, 2010; 6 pages.
USPTO Advisory Action for U.S. Appl. No. 11/811,958 dated Mar. 16, 2010; 3 pages.
USPTO Final Rejection for U.S. Appl. No. 11/811,958 dated Jan. 6, 2010; 17 pages.
USPTO Non-Final Rejection for U.S. Appl. No. 11/811,958 dated May 13, 2009; 14 pages.
USPTO Notice of Allowance for U.S. Appl. No. 10/185,470 dated Jul. 16, 2004; 4 pages.
USPTO Non-Final Rejection for U.S. Appl. No. 10/185,470 dated Feb. 24, 2004; 6 pages.
USPTO Non-Final Rejection for U.S. Appl. No. 10/185,470 dated Oct. 16, 2003; 7 pages.
USPTO Notice of Allowance for U.S. Appl. No. 09/920,378 dated Nov. 10, 2003; 5 pages.
USPTO Advisory Action for U.S. Appl. No. 09/920,378 dated Sep. 5, 2003; 3 pages.
USPTO Advisory Action for U.S. Appl. No. 09/920,378 dated Jun. 25, 2003; 3 pages.
USPTO Final Rejection for U.S. Appl. No. 09/920,378 dated Mar. 28, 2003; 6 pages.
USPTO Non-Final Rejection for U.S. Appl. No. 09/920,378 dated Oct. 21, 2002; 10 pages.
USPTO Restriction Requirement for U.S. Appl. No. 09/920,378 dated Jul. 22, 2002; 4 pages.
USPTO Notice of Allowance for U.S. Appl. No. 10/740,205 dated Jun. 15, 2005; 6 pages.
USPTO Final Rejection for U.S. Appl. No. 10/740,205 dated Mar. 22, 2005; 8 pages.
USPTO Non-Final Rejection for U.S. Appl. No. 10/740,205 dated Jun. 29, 2004; 5 pages.
USPTO Notice of Allowance for U.S. Appl. No. 10/094,108 dated Aug. 22, 2003; 5 pages.
USPTO Non-Final Rejection for U.S. Appl. No. 10/094,108 dated Mar. 31, 2003; 8 pages.
USPTO Restriction Requirement for U.S. Appl. No. 10/094,108 dated Dec. 3, 2002; 4 pages.
Ohring, M., Materials Science of Thin Films, 2nd ed. Academic, 2002, 4 pages.

USPTO Advisory Action for U.S Appl. No. 11/904,475 dated Nov. 24, 2010; 3 pages.
USPTO Advisory Action for U.S Appl. No. 12/197,466 dated Jan. 31, 2012; 3 pages.
USPTO Advisory Action for U.S Appl. No. 13/114,889 dated Aug. 29, 2012; 3 pages.
USPTO Final Rejection for U.S Appl. No. 11/904,475 dated Sep. 28, 2010; 14 pages.
USPTO Final Rejection for U.S Appl. No. 12/124,855 dated Jan. 31, 2012; 7 pages.
USPTO Final Rejection for U.S Appl. No. 12/124,855 dated May 10, 2010; 11 pages.
USPTO Final Rejection for U.S Appl. No. 12/125,864 dated Jul. 1, 2010; 18 pages.
USPTO Final Rejection for U.S Appl. No. 12/185,747 dated Feb. 25, 2010; 12 pages.
USPTO Final Rejection for U.S Appl. No. 12/197,466 dated Nov. 17, 2011; 13 pages.
USPTO Non-Final for U.S Appl. No. 11/904,475 dated Apr. 12, 2011; 14 pages.
USPTO Non-Final Rejection for U.S Appl. No. 11/811,958 dated Oct. 1, 2012; 17 pages.
USPTO Non-Final Rejection for U.S. Appl. No. 11/904,475 dated Apr. 27, 2010; 12 pages.
USPTO Non-Final Rejection for U.S. Appl. No. 12/124,855 dated Jan. 18, 2011; 5 pages.
USPTO Non-Final Rejection for U.S. Appl. No. 12/124,855 dated Aug. 16, 2011; 9 pages.
USPTO Non-Final Rejection for U.S. Appl. No. 12/124,855 dated Oct. 29, 2009; 9 pages.
USPTO Non-Final Rejection for U.S. Appl. No. 12/125,864 dated Apr. 27, 2009; 17 pages.
USPTO Non-Final Rejection for U.S. Appl. No. 12/125,864 dated Nov. 13, 2009; 19 pages.
USPTO Requirement Restriction for U.S. Appl. No. 12/197,466 dated Mar. 11, 2011; 5 pages.
USPTO Non-Final Rejection for U.S. Appl. No. 12/185,747 dated Jul. 1, 2010; 12 pages.
USPTO Non-Final Rejection for U.S. Appl. No. 12/185,747 dated Aug. 6, 2009; 15 pages.
USPTO Non-Final Rejection for U.S. Appl. No. 12/185,751 dated Aug. 4, 2009; 19 pages.
USPTO Non-Final Rejection for U.S. Appl. No. 12/197,466 dated Jun. 1, 2011; 11 pages.
USPTO Notice of Allowance for U.S. Appl. No. 12/124,855 dated May 1, 2012; 7 pages.
USPTO Notice of Allowance for U.S. Appl. No. 12/124,855 dated May 3, 2011; 7 pages.
USPTO Notice of Allowance for U.S. Appl. No. 12/124,855 dated Jul. 28, 2010; 6 pages.
USPTO Notice of Allowance for U.S. Appl. No. 12/124,855 dated Aug. 1, 2012; 7 pages.
USPTO Notice of Allowance for U.S. Appl. No. 12/125,864 dated Apr. 19, 2011; 11 pages.
USPTO Notice of Allowance for U.S. Appl. No. 12/125,864 dated Oct. 31, 2011; 6 pages.
USPTO Notice of Allowance for U.S. Appl. No. 12/185,747 dated Feb. 13, 2012; 6 pages.
USPTO Notice of Allowance for U.S. Appl. No. 12/185,747 dated Jul. 11, 2011; 6 pages.
USPTO Notice of Allowance for U.S. Appl. No. 12/185,747 dated Nov. 17, 2010; 8 pages.
USPTO Notice of Allowance for U.S. Appl. No. 12/185,751 dated Jan. 31, 2011; 5 pages.
USPTO Notice of Allowance for U.S. Appl. No. 12/185,751 dated Feb. 24, 2010; 7 pages.
USPTO Notice of Allowance for U.S. Appl. No. 12/185,751 dated Apr. 6, 2012; 7 pages.
USPTO Notice of Allowance for U.S. Appl. No. 12/185,751 dated Aug. 11, 2010; 7 pages.
USPTO Notice of Allowance for U.S. Appl. No. 12/185,751 dated Oct. 20, 2011; 6 pages.

(56) References Cited

OTHER PUBLICATIONS

USPTO Notice of Allowance for U.S. Appl. No. 12/185,751 dated Nov. 2, 2012; 7 pages.
USPTO Notice of Allowance for U.S. Appl. No. 12/197,466 dated Jun. 15, 2012; 4 pages.
USPTO Notice of Allowance for U.S. Appl. No. 12/197,466 dated Sep. 24, 2012; 8 pages.
USPTO Requirement for Restriction for U.S. Appl. No. 11/904,475 dated Jan. 8, 2010; 8 pages.
USPTO Requirement for Restriction for U.S. Appl. No. 12/185,751 dated Apr. 20, 2009; 7 pages.
USPTO Requirement for Restriction/Election for U.S. Appl. No. 12/185,747 dated Apr. 20, 2009; 7 pages.
Application No. 096136630.0: "SONOS ONO Stack Scaling," filed on Sep. 29, 2007; entire document.
U.S. Appl. No. 11/904,506: "SONOS ONO stack scaling," Fredrick B. Jenne, filed on Sep.26, 2007; 46 pages.
U.S. Appl. No. 12/125,864 "Integration of Non-Volatile Charge Trap Memory Devices and Logic Cmos Devices" William W.C. Koutny Jr et al., Filed on May 22, 2008; 65 pages.
U.S. Appl. No. 12/185,747 "Integration of Non-Volatile Charge Trap Memory Devices and Logic Cmos Devices," Krishnaswamy Ramkumar et al., Filed on Aug. 4, 2008; 66 pages.
U.S. Appl. No. 12/185,751 "Integration of Non-Volatile Charge Trap Memory Devices and Logic Cmos Devices," Krishnaswamy Ramkumar et al., Filed on Aug. 4, 2008; 66 pages.
U.S. Appl. No. 12/197,466: "Radical Oxidation Process for Fabricating a Nonvolatile Charge Trap Memory Device," Ramkumar et al., filed on Aug. 25, 2008; 68 pages.
U.S. Appl. No. 13/428,201: "Method of Integrating a Charge-Trapping Gate Stack Into a CMOS Flow" Krishnaswamy Ramkumar et al., filed on Mar. 23, 2012; 38 pages.
U.S. Appl. No. 13/431,069: "SONOS Stack With Split Nitride Memory Layer" Fredrick Jenne et al., filed on Mar. 27, 2012; 59 pages.
U.S. Appl. No. 13/436,872: "Oxide-Nitride-Oxide Stack Having Multiple Oxynitride Layers" Sagy Levy, Zichron-Yoakev et al., filed on Mar. 31, 2012; 53 pages.
U.S. Appl. No. 13/436,875: "Nonvolatile Charge Trap Memory Device Having a High Dielectric Constant Blocking Region" Igor Polishchuk et al., filed on Mar. 31, 2012; 70 pages.
U.S. Appl. No. 13/436,878: "Integration of Non-Volatile Charge Trap Memory Devices and Logic CMOS Devices" Krishnaswamy Ramkumar et al., filed on Mar. 31, 2012; 90 pages.
U.S. Appl. No. 13/539,461: "Sonos Ono Stack Scaling," Fredrick Jenne, filed on Jul. 1, 2012; 91 pages.
U.S. Appl. No. 13/551,237: "SONOS Stack With Split Nitride Memory Layer" Fredrick Jenne et al., filed on Jul. 17, 2012; 37 Pages.
U.S. Appl. No. 13/620,071: "Method of Fabricating a Nonvolatile Charge Trap Memory Device" Krishnaswamy Ramkumar et al., filled on Sep. 14, 2012; 69 pages.
Application No. 200880000919.3 William W.C. Koutny Jr. et al., Filed on May 23, 2008.
U.S. Appl. No. 60/931,947: "Oxide-nitride- Oxide Stack Having Multiple Oxynitride Layers" Sagy Levy et al., filed on May 25, 2007; 27 pages.
U.S. Appl. No. 60/931,948: "SONOS stack with oxynitride bilayer made of BTBAS and NH3" Sagy Levy et al., filed on May 25, 2007; 11 Pages.
U.S. Appl. No. 60/940,128: "Single Wafer Process for ONO Stack" Krishnaswamy Ramkumar et al., filed on May 25, 2007; 3 pages.
U.S. Appl. No. 60/940,384: "SONOS ONO Stack Scaling" Frederick Jenne et al., filed on May 25, 2007; 33 Pages.
U.S. Appl. No. 61/007,566: "Nonvolatile Charge Trap Memory Device Having A High Dielectric Constant Blocking Region" Igor Polishchuk et al., filed on Dec. 12, 2007; 37 pages.
U.S. Appl. No. 61/172,320: "SONOS stack With Superior Reliability" Fredrick Jenne et al., filed on Apr. 24, 2009; 3 pages.
U.S. Appl. No. 61/599,258 "New Integration of SONOS Stack" Krishnaswamy Ramkumar et al., filed on Feb. 15, 2012: 4 pages.
Application No. PCT/US08/06597 "Integration of Non-Volatile Charge Trap Memory Devices and Logic Cmos Devices," Filed on May 23, 2008; 50 pages.
Application No. PCT/US08/06627 "Radical Oxidation Process for Fabricating a Nonvolatile Charge Trap Memory Device," Filed on May 23, 2008; 53 pages.
International Search Report for International Application No. PCT/US07/20966 dated Apr. 21, 2008; 2 pages.
International Search Report for International Application No. PCT/US07/20988 dated Mar. 14, 2008; 2 pages.
International Search Report for International Application No. PCT/US12/021583 dated Jul. 19, 2012; 2 pages.
SIPO Office Action for Application No. 200780035963.3 dated Feb. 29, 2012; 4 pages.
Uspto Advisory Action for Application No. 11/904,506 dated Aug. 30, 2011; 4 pages.
Uspto Final Rejection for Application No. 11/811,958 dated Mar. 13, 2013; 22 pages.
USPTO Final Rejection for U.S. Appl. No. 11/904506 dated Jun. 7, 2011; 15 pages.
USPTO Final Rejection for U.S. Appl. No. 12/005,813 dated Mar. 6, 2012; 5 pages.
USPTO Final Rejection for U.S. Appl. No. 12/030,644 dated Jan. 24, 2011; 22 pages.
USPTO Final Rejection for U.S. Appl. No. 13/114,889 dated Apr. 2, 2013; 12 pages.
USPTO Final Rejection for U.S. Appl. No. 13/114,889 dated Jun. 4, 2012; 12 pages.
USPTO Miscellaneous Internal Document for U.S. Appl. No. 12/030,644 dated May 28, 2010; 6 pages.
USPTO Non Final Rejection for U.S. Appl. No. 11/811,958 dated Dec. 7, 2011; 13 pages.
USPTO Non Final Rejection for U.S. Appl. No. 11/904505 dated Feb. 3, 2011; 13 pages.
USPTO Non Final Rejection for U.S. Appl. No. 11/904506 dated Aug. 31, 2010; 17 pages.
USPTO Non Final Rejection for U.S. Appl. No. 12/005,813 dated Sep. 23, 2011; 12 pages.
USPTO Non Final Rejection for U.S. Appl. No. 12/030,644 dated May 28, 2010; 19 pages.
USPTO Non Final Rejection for U.S. Appl. No. 12/767,105 dated Apr. 21, 2011; 7 pages.
USPTO Non Final Rejection for U.S. Appl. No. 12/767,105 dated Oct. 18, 2011; 7 pages.
USPTO Non Final Rejection for U.S. Appl. No. 13/007,533 dated Apr. 12, 2012; 9 pages.
USPTO Non Final Rejection for U.S. Appl. No. 13/539,458 dated Mar. 13, 2013; 5 pages.
USPTO Non-Final Rejection for U.S. Appl. No. 11/811,958 dated Oct. 1, 2012; 17 pages.
USPTO Notice of Allowance for U.S. Appl. No. 12/767,105 dated Apr. 4, 2012; 8 pages.
USPTO Notice of Allowance for U.S. Appl. No. 12/767,105 dated May 7, 2012; 7 pages.
USPTO Notice of Allowance for U.S. Appl. No. 13/007,533 dated Mar. 7, 2013; 8 pages.
USPTO Requirement for Restriction for U.S. Appl. No. 11/904,506 dated Apr. 13, 2010; 7 pages.
U.S. Appl. No. 12/080,166: "Sequential Deposition and Anneal of A Dielectic Layer In A Charge Trapping Memory Device" Krishnaswamy Ramkumar et al., filed Mar. 31, 2008; 33 pages.
U.S. Appl. No. 12/080,175: "Plasma Oxidation of A Memory Layer to Form A Blocking Layer In Non Volatile Charge Trap Memory Devices" Krishnaswamy Ramkumar et al., filed on Mar. 31, 2008; 37 pages.
International Search Report for International Application No. PCT/US13/32339 dated May 30, 2013; 2 pages.
USPTO Advisory Action for U.S. Appl. No. 11/811,958 dated May 14, 2013; 4 pages.
USPTO Advisory Action for U.S. Appl. No. 11/811,958 dated Jun. 2, 2011; 5 pages.
USPTO Final Rejection for U.S. Appl. No. 11/811,958 dated Mar. 15, 2011; 13 pages.

(56) References Cited

OTHER PUBLICATIONS

USPTO Final Rejection for U.S. Appl. No. 11/904,513 dated Jun. 24, 2009; 12 pages.
USPTO Non Final Rejection for U.S. Appl. No. 11/811,958 dated Oct. 7, 2010; 12 pages.
USPTO Non Final Rejection for U.S. Appl. No. 11/904,513 dated Dec. 10, 2008; 11 pages.
USPTO Non Final Rejection for U.S. Appl. No. 12/006,961 dated Jun. 24, 2010; 8 pages.
USPTO Non Final Rejection for U.S. Appl. No. 12/080,166 dated Jun. 30, 2010; 11 pages.
USPTO Non Final Rejection for U.S. Appl. No. 12/125,864 dated Nov. 17, 2010; 19 pages.
USPTO Notice of Allowance for U.S. Appl. No. 11/904,513 dated Oct. 9, 2009; 7 pages.
USPTO Notice of Allowance for U.S. Appl. No. 12/006,961 dated Jul. 26, 2011; 8 pages.
USPTO Notice of allowance for U.S. Appl. No. 12/080,166 dated Sep. 1, 2011; 9 pages.
USPTO Notice of Allowance for U.S. Appl. No. 12/080,175 dated May 14, 2010; 10 pages.
USPTO Notice of Allowance for U.S. Appl. No. 12/185,751 dated May 15, 2013; 9 pages.
USPTO Notice of Allowance for U.S. Appl. No. 12/197,466 dated Sep. 24, 2012; 3 pages.
USPTO Notice of Allowance for U.S. Appl. No. 13/539,458 dated May 24, 2013; 8 pages.
USPTO Notice of Allowance for U.S. Appl. No. 13/539,466 dated Nov. 27, 2012; 8 pages.
USPTO Requirement for Restriction for U.S. Appl. No. 11/904,513 dated Oct. 7, 2008; 8 pages.
USPTO Requirement for Restriction for U.S. Appl. No. 12/030,644 dated Oct. 7, 2009; 11 pages.
USPTO Requirement for Restriction for U.S. Appl. No. 12/080,166 dated Mar.19, 2010; 6 pages.
USPTO Requirement for Restriction for U.S. Appl. No. 12/080,175 dated Feb. 3, 2010; 6 pages.
USPTO Requirement for Restriction for U.S. Appl. No. 13/551,237 dated Jun. 17, 2013; 5 pages.
Written Opinion of the International Searching Authority for International Application No. PCT1US13132339 mailed May 30, 2013; 7 pages.
U.S. Appl. No. 12/030,644: "NonVolatile Charge Trap Memory Device Having A High Dielectric Constant Blocking Region" Igor Polishchuk et al., filed on Feb. 13, 2008; 37 pages.
International Search Report for International Application No. PCT/US13/29784 dated May 20, 2013; 2 pages.
International Search Report for International Application No. PCT/US13/32777 dated Jun. 20, 2013; 2 pages.
International Search Report for International Application No. PCT/US13/48876 dated Jul. 26, 2013; 5 pages.
USPTO Advisory Action for U.S. Appl. No. 11/811,958 dated Mar. 16, 2010; 4 pages.
USPTO Advisory Action for U.S. Appl. No. 13/114,889 dated Aug. 2, 2013; 2 pages.
USPTO Final Rejection for U.S. Appl. No. 11/811,958 dated Nov. 6, 2010; 17 pages.
USPTO Non Final Rejection for U.S. Appl. No. 11/811,958 dated May 13, 2009; 14 pages.
USPTO Non Final Rejection for U.S. Appl. No. 13/114,889 dated Sep. 5, 2013; 11 pages.
USPTO Non Final Rejection for U.S. Appl. No. 13/431,069 dated Aug. 16, 2013; 7 pages.
USPTO Non Final Rejection for U.S. Appl. No. 13/436,878 dated Jul. 24, 2013; 12 pages.
USPTO Non Final Rejection for U.S. Appl. No. 13/551,237 dated Jul. 18, 2013; 6 pages.
USPTO Non-Final Rejection for U.S. Appl. No. 11/904,506 dated Feb. 3, 2011; 13 pages.
USPTO Notice of Allowance for U.S. Appl. No. 12/006,961 dated Mar. 15, 2011; 8 pages.
USPTO Notice of Allowance for U.S. Appl. No. 12/006,961 dated Oct. 14, 2010; 4 pages.
USPTO Notice of Allowance for U.S. Appl. No. 13/428,201 dated Aug. 5, 2013; 12 pages.
Written Opinion of the International Searching Authority for International Application No. PCT/13US/32777 dated Jun. 20, 2013; 7 pages.
Written Opinion of the International Searching Authority for International Application No. PCT/US13/29784 mailed May 20, 2013; 6 pages.
Written Opinion of the International Searching Authority for the International Application No. PCT/US 12/21583 dated May 8, 2012; 7 pages.

* cited by examiner

OXIDE-NITRIDE-OXIDE STACK HAVING MULTIPLE OXYNITRIDE LAYERS

CROSS-REFERENCE TO RELATED APPLICATIONS

This application is a continuation-in-part of co-pending U.S. application Ser. No. 11/811,958, filed Jun. 13, 2007, which claims the benefit of priority under 35 U.S.C. 119(e) to U.S. Provisional Patent Application Ser. No. 60/931,947, filed May 25, 2007, both of which are incorporated by reference herein.

TECHNICAL FIELD

This invention relates to semiconductor processing and, more particularly to an oxide-nitride-oxide stack having an improved oxide-nitride or oxynitride layer and methods of forming the same.

BACKGROUND

Non-volatile semiconductor memories, such as a split gate flash memory, typically use a stacked floating gate type field effect transistors, in which electrons are induced into a floating gate of a memory cell to be programmed by biasing a control gate and grounding a body region of a substrate on which the memory cell is formed.

An oxide-nitride-oxide (ONO) stack is used as either a charge storing layer, as in silicon-oxide-nitride-oxide-silicon (SONOS) transistor, or as an isolation layer between the floating gate and control gate, as in a split gate flash memory.

FIG. 1 is a partial cross-sectional view of an intermediate structure for a semiconductor device 100, such as a memory device, having a SONOS gate stack or structure 102 including a conventional ONO stack 104 formed over a surface 106 of a silicon substrate 108 according to a conventional method. In addition, the device 100 typically further includes one or more diffusion regions 110, such as source and drain regions, aligned to the gate stack and separated by a channel region 112. Briefly, the SONOS structure 102 includes a poly-silicon (poly) gate layer 114 formed upon and in contact with the ONO stack 104. The poly gate layer 114 is separated or electrically isolated from the substrate 108 by the ONO stack 104. The ONO stack 104 generally includes a lower oxide layer 116, a nitride or oxynitride layer 118 which serves as a charge storing or memory layer for the device 100, and a top, high-temperature oxide (HTO) layer 120 overlying the nitride or oxynitride layer.

One problem with conventional SONOS structures 102 and methods of forming the same is the poor data retention of the nitride or oxynitride layer 118 that limits the device 100 lifetime and/or its use in several applications due to leakage current through the layer.

Another problem with conventional SONOS structures 102 and methods of forming the same is the stochiometry of the oxynitride layer 118 is neither uniform nor optimized across the thickness of the layer. In particular, the oxynitride layer 118 is conventionally formed or deposited in a single step using a single process gas mixture and fixed or constant processing conditions in an attempt to provide a homogeneous layer having a high nitrogen and high oxygen concentration across the thickness of the relatively thick layer. However, due to top and bottom effects this results in nitrogen, oxygen and silicon concentrations, which can vary throughout the conventional oxynitride layer 118. The top effect is caused by the order in which process gases are shut off following deposition. In particular, the silicon containing process gas, such as silane, is typically shut off first resulting in a top portion of the oxynitride layer 118 that is high in oxygen and/or nitride and low in silicon. Similarly, the bottom effect is caused by the order in which process gases are introduced to initiate deposition. In particular, the deposition of the oxynitride layer 118 typically follows an annealing step, resulting in a peak or relatively high concentration of ammonia ($NH_3$) at the beginning of the deposition process and producing in a bottom portion of the oxynitride layer that is low in oxygen and silicon and high in nitrogen. The bottom effect is also due to surface nucleation phenomena in which that oxygen and silicon that is available in the initial process gas mixture preferentially reacts with silicon at the surface of the substrate and does not contribute to the formation of the oxynitride layer. Consequently, the charge storage characteristics, and in particular programming and erase speed and data retention of a memory device 100 made with the ONO stack 104, are adversely effected.

Accordingly, there is a need for a memory device having an ONO stack with an oxynitride layer as a memory layer that exhibits improved programming and erase speed and data retention. There is a further need for a method or process of forming an ONO stack having an oxynitride layer that exhibits improved oxynitride stochiometry.

SUMMARY

A semiconductor device including a silicon-oxide-oxynitride-oxide-silicon structure and methods of forming the same are provided. In one embodiment, the structure comprises: a tunnel oxide layer on a surface of a substrate including silicon; a multi-layer charge storing layer including an oxygen-rich, first oxynitride layer on the tunnel oxide layer in which the stoichiometric composition of the first oxynitride layer results in it being substantially trap free, and an oxygen-lean, second oxynitride layer on the first oxynitride layer in which the stoichiometric composition of the second oxynitride layer results in it being trap dense; a blocking oxide layer on the second oxynitride layer; and a silicon containing gate layer on the blocking oxide layer.

In one embodiment, the method includes: (i) forming a tunnel oxide layer on a silicon containing layer of a substrate; (ii) forming a multi-layer charge storing layer by depositing on the tunnel oxide layer an oxygen-rich first oxynitride layer in which the stoichiometric composition of the first oxynitride layer results in it being substantially trap free; and depositing on the first oxynitride layer an oxygen-lean second oxynitride layer in which the stoichiometric composition of the second oxynitride layer results in it being trap dense; (iii) forming a blocking oxide layer on the second oxynitride layer; and (iv) forming a silicon containing gate layer on the blocking oxide layer.

BRIEF DESCRIPTION OF THE DRAWINGS

These and various other features and advantages of the present structure and method will be apparent upon reading of the following detailed description in conjunction with the accompanying drawings and the appended claims provided below, where:

DETAILED DESCRIPTION

Figure 1:
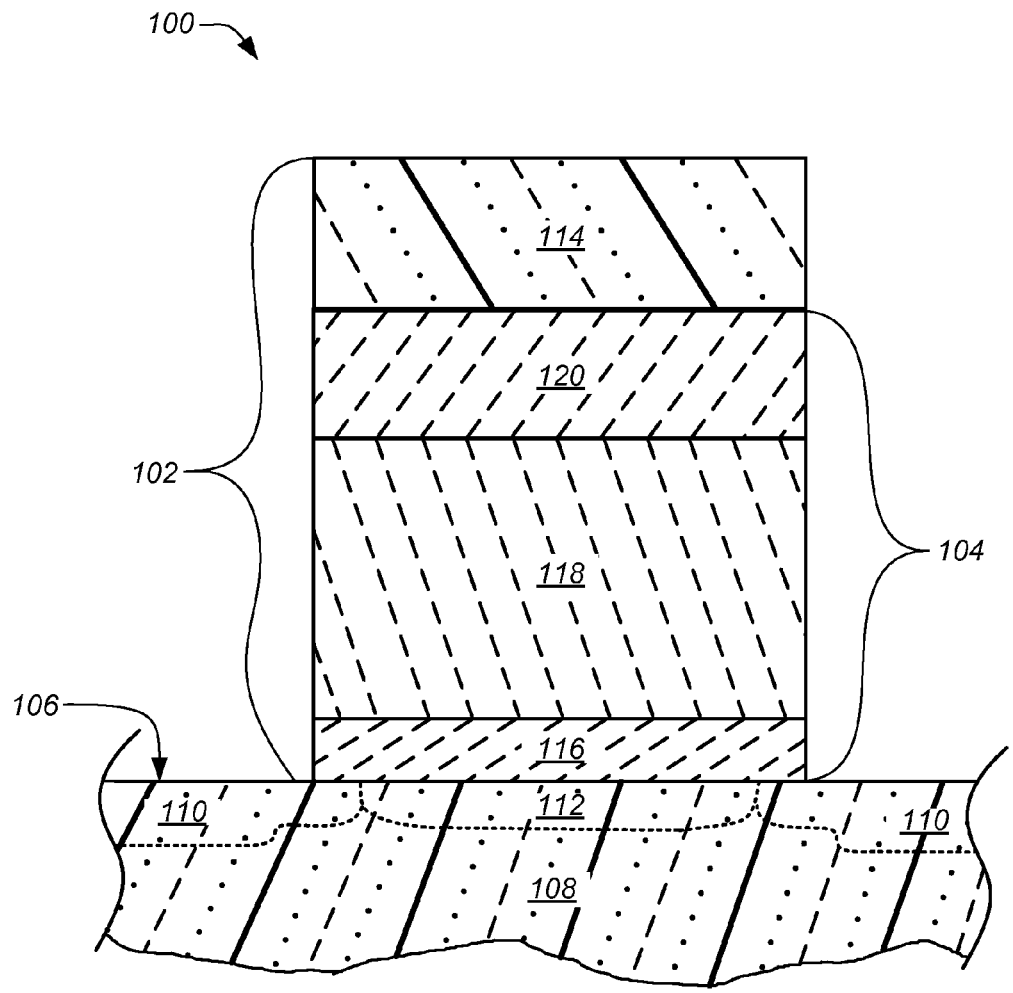
FIG. 1 (prior art) is a block diagram illustrating a cross-sectional side view of an intermediate structure for a memory device for which a method having an oxide-nitride-oxide (ONO) stack formed according to conventional method.

The present invention is directed generally to a device comprising a silicon-oxide-oxynitride-oxide-silicon gate structure including a multi-layer charge storing layer and methods for making the same. The gate structure and method are particularly useful for forming a memory layer in a memory device, such as a memory transistor.

In the following description, for purposes of explanation, numerous specific details are set forth in order to provide a thorough understanding of the present disclosure. It will be evident, however, to one skilled in the art that the present structure and method may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment. The appearances of the phrase "in one embodiment" in various places in the specification do not necessarily all refer to the same embodiment. The term "to couple" as used herein may include both to directly connect and to indirectly connect through one or more intervening components.

Briefly, the method involves forming a multi-layer charge storing layer including multiple oxynitride layers, such as silicon oxynitride ($Si_2N_2O$) layers, having differing concentrations of Oxygen, Nitrogen and/or Silicon. The oxynitride layers are formed at higher temperatures than nitride or oxynitride layers in conventional ONO structures, and each of the layers are formed using differing process gases mixtures and/or at differing flow rates. Generally, the oxynitride layers include at least a top oxynitride layer and a bottom oxynitride layer. In certain embodiments, the stoichiometric compositions of the layers is tailored or selected such that the lower or bottom oxynitride has a high oxygen and silicon content, and the top oxynitride layer has high silicon and a high nitrogen concentration with a low oxygen concentration to produce an oxygen-lean, silicon-rich nitride or oxynitride. The silicon-rich and oxygen-rich bottom oxynitride layer reduces stored charge loss without compromising device speed or an initial (beginning of life) difference between program and erase voltages. The silicon-rich, oxygen-lean top oxynitride layer increases a difference between programming and erase voltages of memory devices, thereby improving device speed, increasing data retention, and extending the operating life of the device. In some embodiments, the silicon-rich, oxygen-lean top oxynitride layer can further include a concentration of carbon selected to increase the number of traps therein.

Optionally, the ratio of thicknesses between the top oxynitride layer and the bottom oxynitride layer can be selected to facilitate forming of the oxynitride layers over a tunneling or first oxide layer of a silicon-oxide-oxynitride-oxide-silicon gate structure following the forming of the first oxide layer using a dry or wet oxidation.

A silicon-oxide-oxynitride-oxide-silicon structure and methods for fabricating the same according to various embodiments of the present disclosure will now be described in greater detail with reference to FIGS. 2 through 4.

Figure 2:
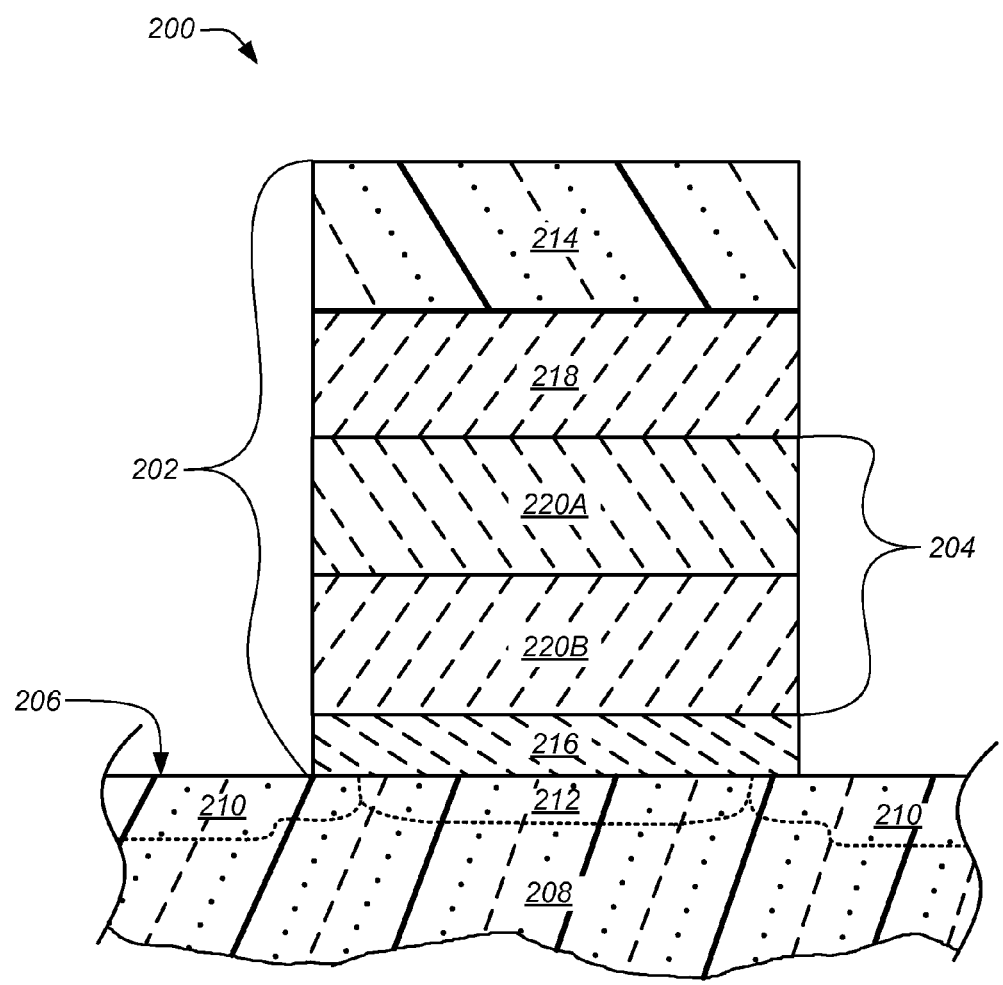
FIG. 2 is a block diagram illustrating a cross-sectional side view of a portion of a semiconductor device having a siliconoxide-oxynitride-oxide-silicon structure including a multi-layer charge storing layer according to an embodiment of the present disclosure.

FIG. 2 is a block diagram illustrating a cross-sectional side view of a portion of a semiconductor memory device 200 having a silicon-oxide-oxynitride-oxide-silicon gate structure including a multi-layer charge storing layer according to one embodiment. Referring to FIG. 2, the memory device 200 includes a silicon-oxide-oxynitride-oxide-silicon gate structure or gate stack 202 including a multi-layer charge storing layer 204 formed over a surface 206 of silicon layer on a substrate or a silicon substrate 208. In addition, the device 200 further includes one or more diffusion regions 210, such as source and drain regions or structures, aligned to the gate stack 202 and separated by a channel region 212. Generally, the silicon-oxide-oxynitride-oxide-silicon gate structure includes a silicon containing gate layer, such as a poly-silicon or poly gate layer 214 formed upon and in contact with the multi-layer charge storing layer 204, and a portion of the silicon layer or substrate 208. The poly gate layer 214 is separated or electrically isolated from the substrate 208 by the multi-layer charge storing layer 204. The silicon-oxide-oxynitride-oxide-silicon structure includes a thin, lower oxide layer or tunneling oxide layer 216 that separates or electrically isolates the gate stack 202 from the channel region 212, a top or blocking oxide layer 218, and the multi-layer charge storing layer 204. As noted above and as shown in FIG. 2, the multi-layer charge storing layer 204 includes at least two oxynitride layers, including a top oxynitride layer 220A and a bottom oxynitride layer 220B.

The substrate 208 may include any known silicon-based semiconductor material including silicon, silicon-germanium, silicon-on-insulator, or silicon-on-sapphire substrate. Alternatively, the substrate 208 may include a silicon layer formed on a non-silicon-based semiconductor material, such as gallium-arsenide, germanium, gallium-nitride, or aluminum-phosphide. In certain embodiments, the substrate 208 is a doped or undoped silicon substrate.

The lower oxide layer or tunneling oxide layer 216 of the silicon-oxide-oxynitride-oxide-silicon structure generally includes a relatively thin layer of silicon dioxide ($SiO_2$) of from about 15 angstrom (Å) to about 22 Å, and in some embodiments about 18 Å. The tunneling oxide layer 216 can be formed or deposited by any suitable means including, for example, being thermally grown or deposited using chemical vapor deposition (CVD). Generally, the tunnel oxide layer is formed or grown using a thermal oxidation in oxygen ambient. In one embodiment, the process involves a dry oxidation method in which the substrate 208 is placed in a in a deposition or processing chamber, heated to a temperature from about 700° C. to about 850° C., and exposed to oxygen for a predetermined period of time selected based on a desired thickness of the finished tunneling oxide layer 216. In another embodiment, the tunnel oxide layer is grown in an ISSG (In-Situ Steam Generation) chamber with a radical oxidation using a reaction between oxygen ($O_2$) and hydrogen ($H_2$) on the substrate at temperatures of at least 1000° C. Exemplary process times are from about 10 to about 100 minutes. The oxidation can be performed at atmospheric or at low pressure.

As noted above, the multi-layer charge storing layer generally includes at least two oxynitride layers having differing compositions of silicon, oxygen and nitrogen, and can have an overall thickness of from about 70 Å to about 150 Å, and in certain embodiments about 100 Å. In one embodiment, the oxynitride layers are formed or deposited in a low pressure CVD process using a silicon source, such as silane ($SiH_4$), chlorosilane ($SiH_3Cl$), dichlorosilane or DCS ($SiH_2Cl_2$), tetrachlorosilane ($SiCl_4$) or Bis-TertiaryButylAmino Silane (BTBAS), a nitrogen source, such as nitrogen (N2), ammonia ($NH_3$), nitrogen trioxide ($NO_3$) or nitrous oxide ($N_2O$), and an oxygen-containing gas, such as oxygen ($O_2$) or $N_2O$. Alternatively, gases in which hydrogen has been replaced by deuterium can be used, including, for example, the substitution of deuterated-ammonia ($ND_3$) for $NH_3$. The substitution of deuterium for hydrogen advantageously passivates Si dangling bonds at the silicon-oxide interface, thereby increasing an NBTI (Negative Bias Temperature Instability) lifetime of the devices.

For example, the lower or bottom oxynitride layer 220B can be deposited over the tunneling oxide layer 216 by placing the substrate 208 in a deposition chamber and introducing a process gas including $N_2O$, $NH_3$ and DCS, while maintaining the chamber at a pressure of from about 5 millitorr (mT) to about 500 mT, and maintaining the substrate at a temperature of from about 700° C. to about 850° C. and in certain embodiments at least about 760° C., for a period of from about 2.5 minutes to about 20 minutes. In particular, the process gas can include a first gas mixture of $N_2O$ and $NH_3$ mixed in a ratio of from about 8:1 to about 1:8 and a second gas mixture of DCS and $NH_3$ mixed in a ratio of from about 1:7 to about 7:1, and can be introduced at a flow rate of from about 5 to about 200 standard cubic centimeters per minute (sccm). It has been found that an oxynitride layer produced or deposited under these condition yields a silicon-rich, oxygen-rich, bottom oxynitride layer 220B, that decrease the charge loss rate after programming and after erase, which is manifested in a small voltage shift in the retention mode.

The top oxynitride layer 220A can be deposited over the bottom oxynitride layer 220B in a CVD process using a process gas including $N_2O$, $NH_3$ and DCS, at a chamber pressure of from about 5 mT to about 500 mT, and at a substrate temperature of from about 700° C. to about 850° C. and in certain embodiments at least about 760° C., for a period of from about 2.5 minutes to about 20 minutes. In particular, the process gas can include a first gas mixture of N2O and NH3 mixed in a ratio of from about 8:1 to about 1:8 and a second gas mixture of DCS and NH 3 mixed in a ratio of from about 1:7 to about 7:1, and can be introduced at a flow rate of from about 5 to about 20 sccm. It has been found that an oxynitride layer produced or deposited under these condition yields a silicon-rich, nitrogen-rich, and oxygen-lean top oxynitride layer 220A, which improves the speed and increases of the initial difference between program and erase voltage without compromising a charge loss rate of memory devices made using an embodiment of the silicon-oxide-oxynitride-oxide-silicon structure, thereby extending the operating life of the device.

In some embodiments, the silicon-rich, nitrogen-rich, and oxygen-lean top oxynitride layer 220A can be deposited over the bottom oxynitride layer 220B in a CVD process using a process gas including BTBAS and ammonia ($NH_3$) mixed at a ratio of from about 7:1 to about 1:7 to further include a concentration of carbon selected to increase the number of traps therein. The selected concentration of carbon in the second oxynitride layer can include a carbon concentration of from about 5% to about 15%.

In certain embodiments, the top oxynitride layer 220A is deposited sequentially in the same tool used to form the bottom oxynitride layer 220B, substantially without breaking vacuum on the deposition chamber. In certain embodiments, the top oxynitride layer 220A is deposited substantially without altering the temperature to which the substrate 208 was heated during deposition of the bottom oxynitride layer 220B. In one embodiment, the top oxynitride layer 220A is deposited sequentially and immediately following the deposition of the bottom oxynitride layer 220B by decreasing the flow rate of the $N_2O/NH_3$ gas mixture relative to the $DCS/NH_3$ gas mixture to provide the desired ratio of the gas mixtures to yield the silicon-rich, nitrogen-rich, and oxygen-lean top oxynitride layer 220A.

In certain embodiments, another oxide or oxide layer (not shown in these figures) is formed after the formation of the gate stack 202 in a different area on the substrate 208 or in the device using a steam oxidation. In this embodiment, the top oxynitride layer 220A and top or blocking oxide layer 218 of the silicon-oxide-oxynitride-oxide-silicon structure are beneficially steam annealed during the steam oxidation process. In particular, steam annealing improves the quality of the top or blocking oxide layer 218 reducing the number of traps formed near a top surface of the blocking oxide layer and near a top surface of the underlying top oxynitride layer 220A, thereby reducing or substantially eliminating an electric field that could otherwise form across the blocking oxide layer, which could result in back streaming of charge carriers therethrough and adversely affecting data or charge retention in the charge storing layer.

A suitable thickness for the bottom oxynitride layer 220B has been found to be from about 10 Å to about 80 Å, and a ratio of thicknesses between the bottom layer and the top oxynitride layer has been found to be from about 1:6 to about 6:1, and in certain embodiments at least about 1:4.

The top or blocking oxide layer 218 of the silicon-oxide-oxynitride-oxide-silicon structure includes a relatively thick layer of $SiO_2$ of from about 30 Å to about 70 Å, and in certain embodiments about 45 Å. The top or blocking oxide layer 218 can be formed or deposited by any suitable means including, for example, being thermally grown or deposited using CVD. In one embodiment, the top or blocking oxide layer 218 is a high-temperature-oxide (HTO) deposited using CVD process. Generally, the deposition process involves exposing the substrate 208 to a silicon source, such as silane, chlorosilane, or dichlorosilane, and an oxygen-containing gas, such as $O_2$ or $N_2O$ in a deposition chamber at a pressure of from about 50 mT to about 1000 mT, for a period of from about 10 minutes to about 120 minutes while maintaining the substrate at a temperature of from about 650° C. to about 850° C.

In certain embodiments, the top or blocking oxide layer 218 is deposited sequentially in the same tool used to form the oxynitride layers 220A, 220B. In certain embodiments, the oxynitride layers 220A, 220B, and the top or blocking oxide layer 218 are formed or deposited in the same tool used to grow the tunneling oxide layer 216. Suitable tools include, for example, an ONO AVP, commercially available from AVIZA technology of Scotts Valley, Calif.

A method or forming or fabricating a silicon-oxide-oxynitride-oxide-silicon stack according to one embodiment will now be described with reference to the flowchart of FIG. 3.

Figure 3:
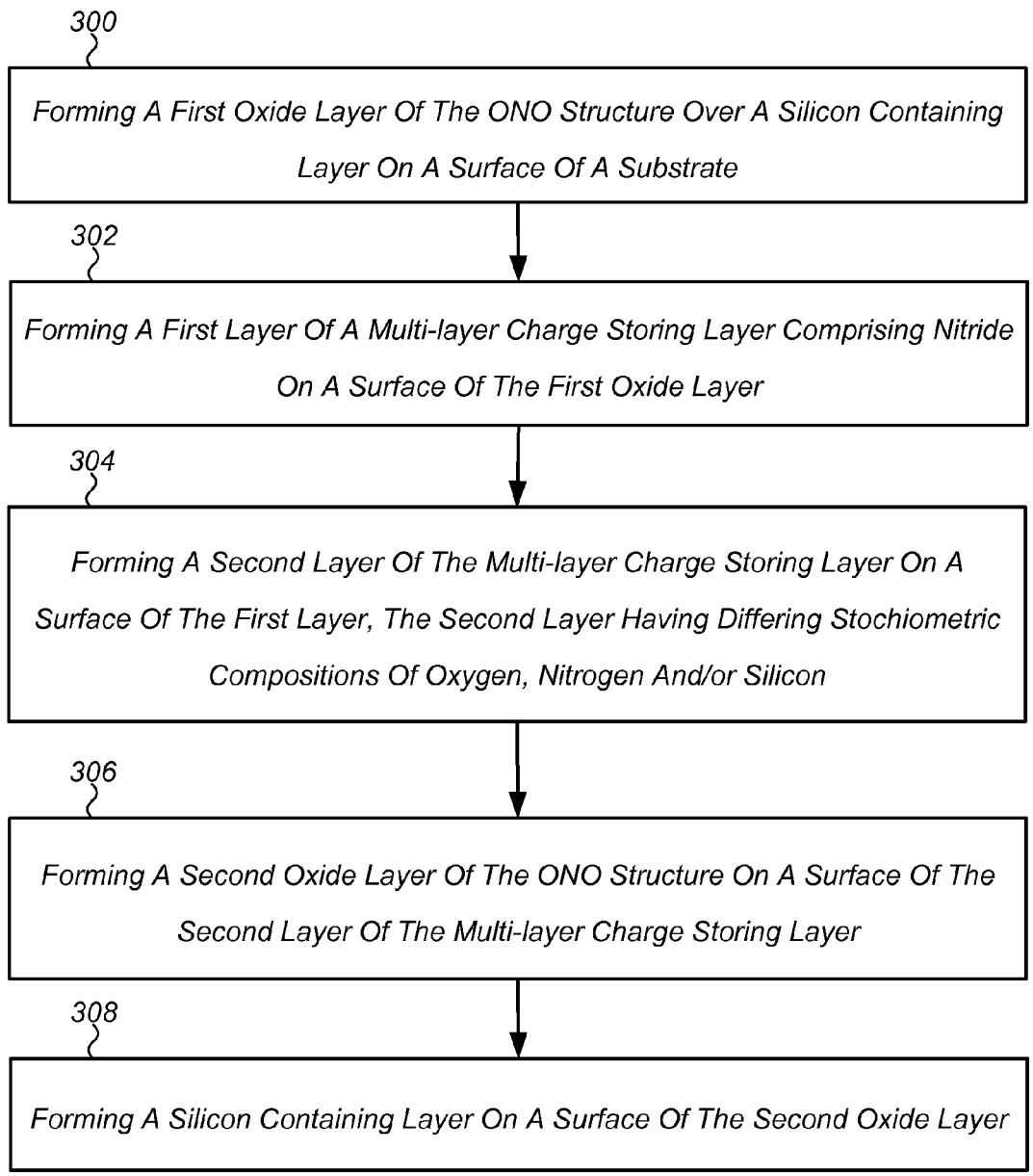
FIG. 3 is flow chart of a method for forming an oxide-oxynitride-oxide structure including a multi-layer charge storing layer according to an embodiment of the present disclosure.

Referring to FIG. 3, the method begins with forming a first oxide layer, such as a tunneling oxide layer 216, of the silicon-oxide-oxynitride-oxide-silicon gate stack 202 over a silicon containing layer on a surface of a substrate 208 (300). Next, the first or bottom oxynitride layer 220B of a multi-layer charge storing layer 204 including oxynitride is formed on a surface of the first oxide layer (302). As noted above, this first or bottom oxynitride layer 220B can be formed or deposited by a CVD process using a process gas including $N_2O/NH_3$ and DC S/$NH_3$ gas mixtures in ratios and at flow rates tailored to provide a silicon-rich and oxygen-rich oxynitride layer. The second or top oxynitride layer 220A of the multi-layer charge storing layer 204 is then formed on a surface of the first or bottom oxynitride layer 220B (304). The second or top oxynitride layer 220A has a stoichiometric composition of oxygen, nitrogen and/or silicon different from that of the first or bottom oxynitride layer 220B. In particular, and as noted above, the second or top oxynitride layer 220A can be formed or deposited by a CVD process using a process gas including DC S/$NH_3$ and $N_2O/NH_3$ gas mixtures in ratios and at flow rates tailored to provide a silicon-rich, oxygen-lean top oxynitride layer. Finally, a top or blocking oxide layer 218 of the silicon-oxide-oxynitride-oxide-silicon structure is formed on a surface of the second layer of the multi-layer charge storing layer (306). As noted above, this top or blocking oxide layer 218 can be formed or deposited by any suitable means, but in some embodiments is deposited in a CVD process. In one embodiment the top or blocking oxide layer 218 is a high temperature oxide deposited in a HTO CVD process. Alternatively, the top or blocking oxide layer 218 can be thermally grown, however it will be appreciated that in this embodiment the thickness of the top oxynitride 220A may be adjusted or increased as some of the top oxynitride will be effectively consumed or oxidized during the process of thermally growing the top or blocking oxide layer 218.

Optionally, the method may further include forming or depositing a silicon containing layer on a surface of the top or blocking oxide layer 218 to form a silicon-oxide-oxynitride-oxide-silicon stack or structure (308). The silicon containing layer can be, for example, a polysilicon layer deposited by a CVD process to form a control or poly gate layer 214 of the transistor or device 200.

A comparison of data retention for a memory device using a memory layer formed according to an embodiment of the present disclosure as compared to a memory device using a conventional memory layer will now be made with reference to FIG. 4. In particular, FIG. 4 illustrates the change in threshold voltage of devices in an electronically erasable programmable read-only memory (EEPROM) during programming (VTP) during erase (VTE) over device life for an EEPROM made using a conventional ONO structure and a silicon-oxide-oxynitride-oxide-silicon structure having a multi-layer oxynitride layer. In gathering data for this figure both devices were pre-cycled for 100K cycles at an ambient temperature of 85° C.

Figure 4:
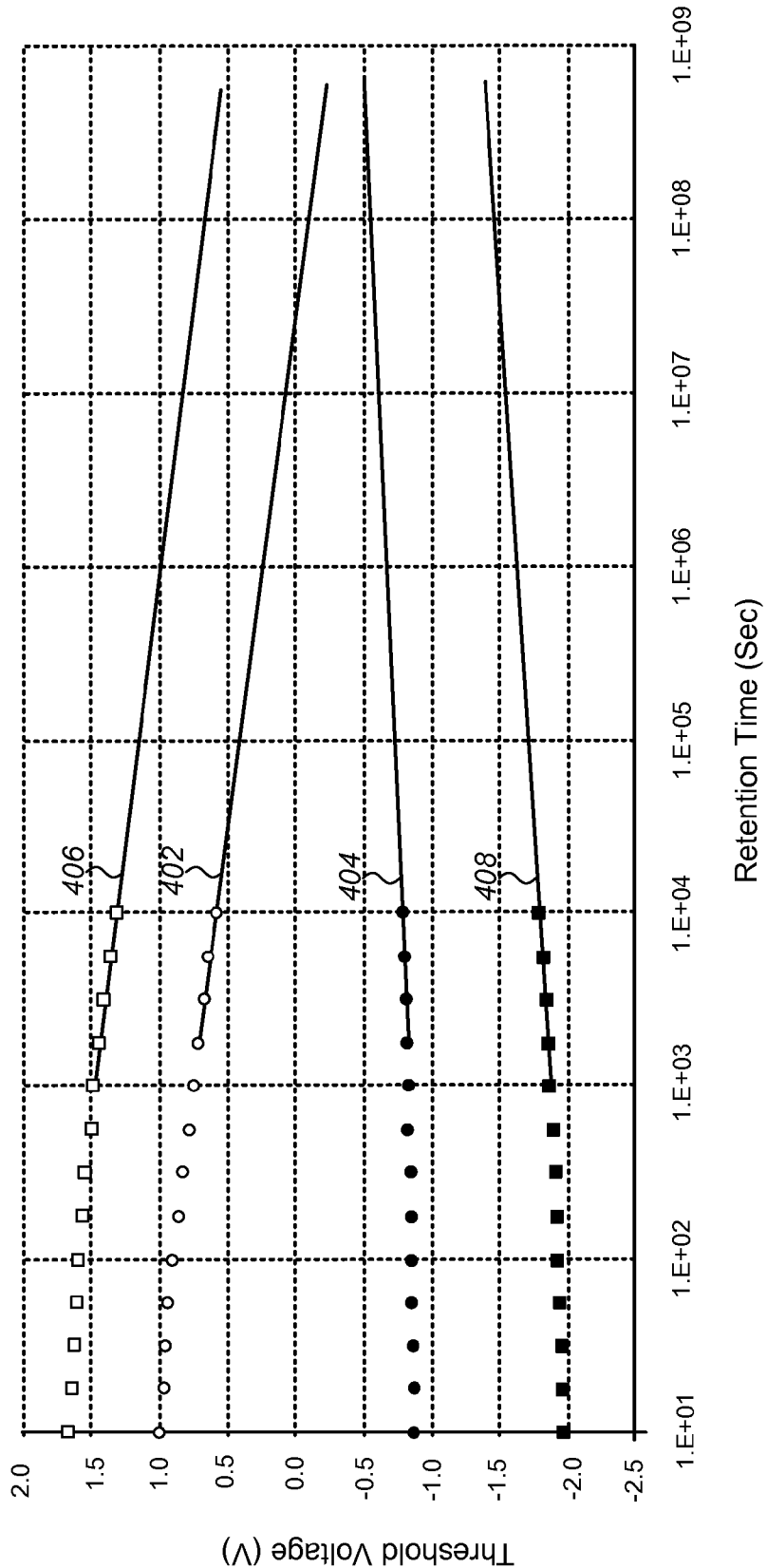
FIG. 4 is a graph showing an improvement in data retention for a memory device using a memory layer formed according to the present disclosure as compared to a memory device using a conventional memory layer.

Referring to FIG. 4, the graph or line 402 illustrates the change over time of a VTP for an EEPROM made using a conventional ONO structure having a single oxynitride layer without refreshing the memory after the initial writing—program or erase. Actual data points on line 402 are shown by unfilled circles, the remainder of the line showing an extrapolation of VTP to a specified end-of-life (EOL) for the EEPROM. Graph or line 404 illustrates the change over time of a VTE for the EEPROM made using a conventional ONO structure. Actual data points on line 404 are shown by filled circles, and the remainder of the line shows an extrapolation of VTE to EOL for the EEPROM. Generally, the specified difference between the VTE and VTP for an EEPROM at EOL is at least 0.5 V to be able to identify or sense the difference between the program and erase state. As seen from this figure an EEPROM made using a conventional ONO structure has a difference between VTE and VTP of about 0.35V at a specified EOL of 20 years. Thus, an EEPROM made using a conventional ONO structure and operated under the conditions described above will fail to meet the specified operating life by at least about 17 years.

In contrast, the change in VTP and VTE over time for an EEPROM made using a silicon-oxide-oxynitride-oxide-silicon structure having a multi-layer oxynitride layer, illustrated by lines 406 and 408 respectively, shows a difference between VTE and VTP of at least about 1.96V at the specified EOL. Thus, an EEPROM made using a silicon-oxide-oxynitride-oxide-silicon structure according to an embodiment of the present disclosure will meet and exceed the specified operating life of 20 years. In particular, graph or line 406 illustrates the change over time of VTP for an EEPROM using a silicon-oxide-oxynitride-oxide-silicon structure according to an embodiment of the present disclosure. Actual data points on line 406 are shown by unfilled squares, the remainder of the line showing an extrapolation of VTP to the specified EOL. Graph or line 408 illustrates the change over time of VTE for the EEPROM, and actual data points on line 408 are shown by filled squares, the remainder of the line showing an extrapolation of VTE to EOL.

A method or forming or fabricating a semiconductor device according to another embodiment is now described with reference to the flowchart of FIG. 5.

Figure 5:
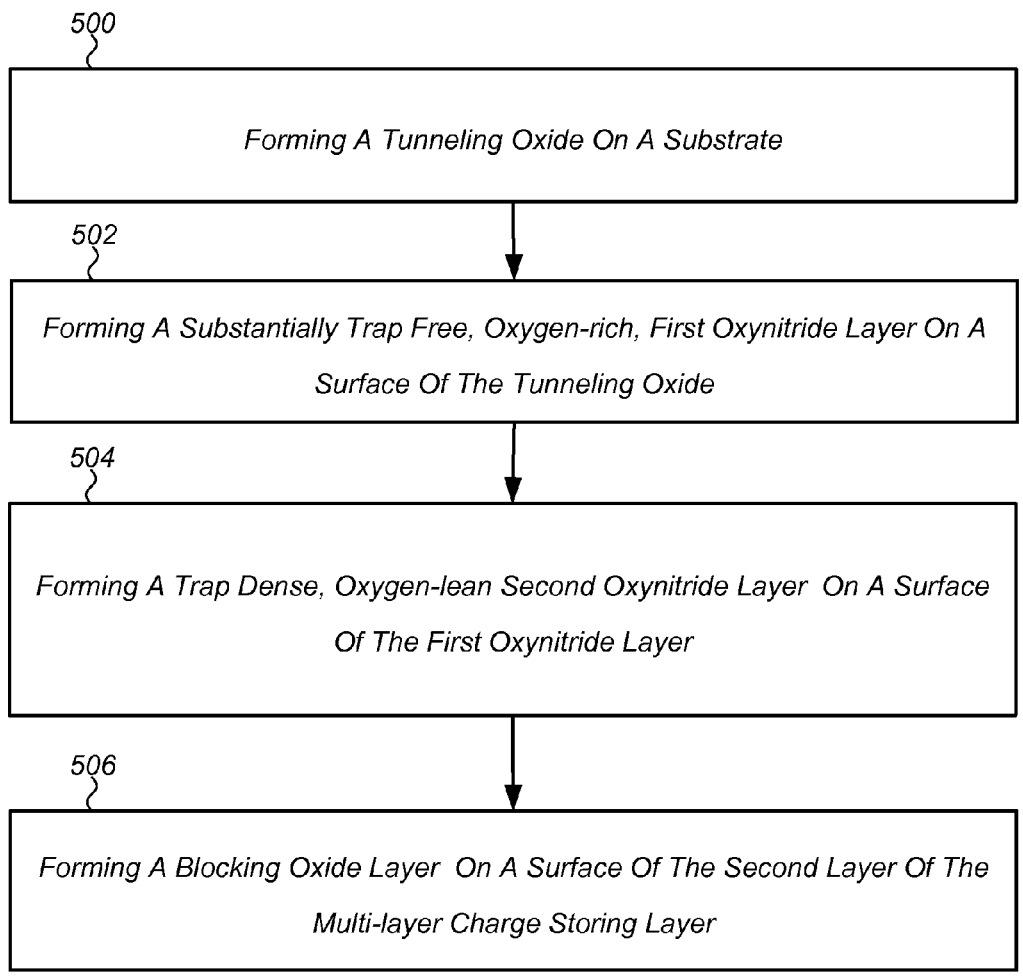
FIG. 5 is flow chart of a method for forming an oxide-oxynitride-oxide structure including a multi-layer charge storing layer according to another embodiment of the present disclosure.

Referring to FIG. 5, the method begins with forming a tunneling oxide layer 216 on a substrate (500). Next, an oxygen-rich, first or bottom oxynitride layer 220B of a multi-layer charge storing layer 204 is formed on a surface of the tunneling oxide layer 216 (502). As noted above, this oxygen-rich, first or bottom oxynitride layer 220B can be formed or deposited by a CVD process using a process gas comprising a dichlorosilane ($SiH_2Cl_2$)/ammonia ($NH_3$) mixture at a ratio in the range of about 5:1 to 15:1; and a nitrous oxide ($N_2O$)/$NH_3$ mixture at a ratio in the range of about 2:1 to 4:1 and at flow rates tailored to provide a silicon-rich and oxygen-rich oxynitride layer which is substantially trap free. That is the stoichiometric composition of the first or bottom oxynitride layer 220B comprises a high concentration of oxygen selected to increase retention performance of the multi-layer charge storing layer by acting as a barrier between charge trapped in the second or top oxynitride layer 220A and the substrate 208. The selected concentration of oxygen in the first or bottom oxynitride layer 220B can include an oxygen concentration of from about 15% to about 40%, and, in certain embodiments about 35%.

An oxygen-lean, second or top oxynitride layer 220A is then formed on a surface of the first or bottom oxynitride layer 220B (504). The second or top oxynitride layer 220A has a stoichiometric composition of oxygen, nitrogen and/or silicon different from that of the first layer. In particular, and as noted above, the second or top oxynitride layer 220A can be formed or deposited by a CVD process using a process gas using a process gas comprising a $N_2O/NH_3$ mixture at a ratio in the range of about 1:6 to 1:8 and a $SiH_2Cl_2/NH_3$ mixture at a ratio in the range of about 1.5:1 to 3:1 to provide a trap dense oxynitride layer having an oxygen concentration of about 5% or less. Thus, the second or top oxynitride layer 220A comprises a charge trap density at least 1000 times greater than the first or bottom oxynitride layer 220B.

Finally, a top or blocking oxide layer 218 is formed over the second or top oxynitride layer 220A of the multi-layer charge storing layer 204 (506). As noted above, this top or blocking oxide layer 218 can be formed or deposited by any suitable means. In one embodiment the second or blocking oxide layer 218 is formed in a manner that results in thinning of the second or top oxynitride layer 220A to a predetermined thickness through oxidization of a portion of the second oxynitride layer. Finally, as noted above with respect to FIG. 4, the increased retention performance of the multi-layer charge storing layer 204 increases an end-of-life (EOL) for the semiconductor device at a specified difference between program voltage (VTP) and erase voltage (VTE) to at least about 20 years.

Figure 6:
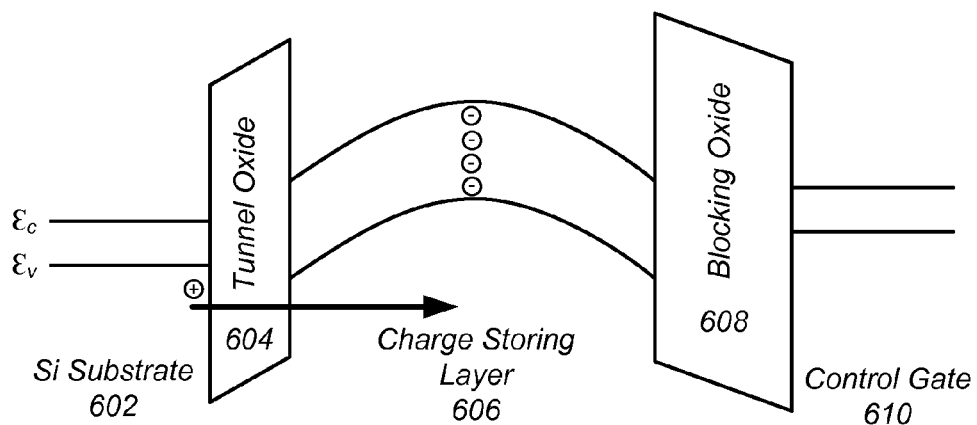
FIG. 6 is an energy band diagram of a programmed conventional memory device having an ONO structure.
Figure 7A:
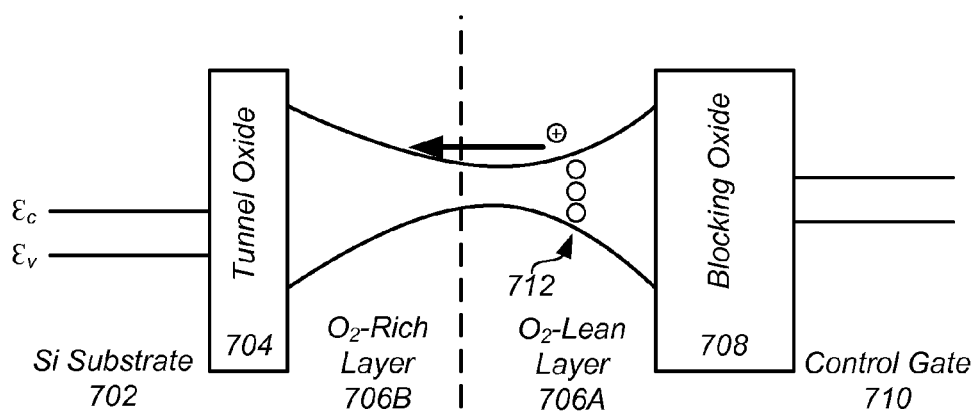
FIGS. 7A and 7B are energy band diagrams of a memory device including a multi-layer charge storing layer according to an embodiment of the present disclosure prior to and following programming.
Figure 7B:
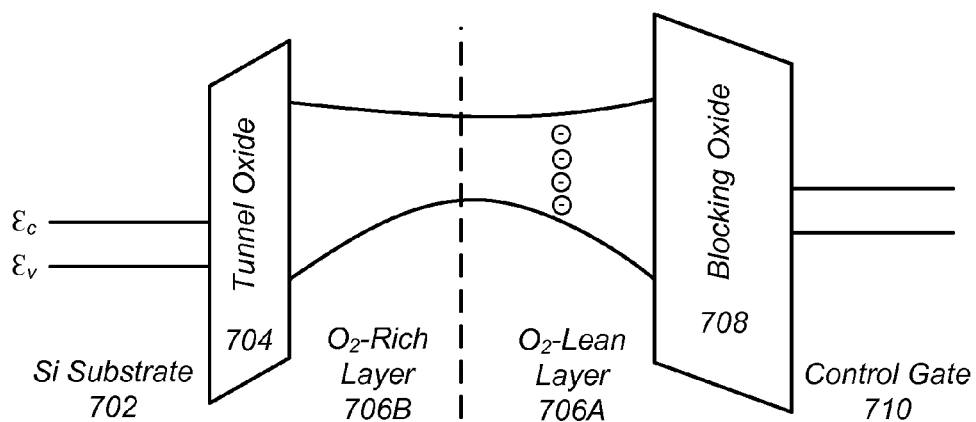

In another aspect, the multi-layer charge storing layer of the present disclosure has bandgap energy engineered to generate an electrical field opposing that built-up due to charge storage in the charge storing layer in a programmed state, thereby increasing data retention, without impacting programming voltages and/or device speed. An energy band diagram of a programmed conventional device including a channel in silicon substrate 602, a tunneling oxide layer 604, a homogeneous nitride or oxynitride charge storing layer 606, oxide blocking layer 608 and a polysilicon control gate 610 is illustrated in FIG. 6. Referring to FIG. 6, it is noted that large number of trapped charges located near the center of the charge storing layer 606 results in a build-up of a large electric field away from the tunneling oxide layer 604 towards the trapped charges, and which can cause or result in loss of stored charges In contrast, in a memory device including the multi-layer charge storing layer of the present disclosure engineering the bandgap energy multi-layer charge storing layer results in a build-up of an electrical field pointing inward (from the charge storing layer toward the tunnel oxide), which opposes the build-up of the electric field due to the stored charge increasing charge retention. An unprogrammed memory device including a multi-layer charge storing layer 706 is shown in FIG. 7A. The device includes a channel in silicon substrate 702, a tunneling oxide layer 704, an oxygen-lean oxynitride layer 706A, an oxygen-rich bottom oxynitride layer 706B, an oxide blocking layer 708 and a polysilicon control gate 710. Referring to FIG. 7A, the trap sites in the oxygen-lean top oxynitride layer 706A, produces an electric field that will oppose the electric field produced by the trapped charges in the programmed device. The resultant bandgap diagram of a device including a multi-layer charge storing layer 706 in a programmed state is shown in FIG. 7A.

Although shown and described above as having only two oxynitride layer, i.e., a top and a bottom layer, the present disclosure is not so limited, and the multi-layer charge storing layer can include any number, n, of oxynitride layers, any or all of which may have differing stoichiometric compositions of oxygen, nitrogen and/or silicon. In particular, multi-layer charge storing layers having up to five oxynitride layers each with differing stoichiometric compositions have been produced and tested. However, as will be appreciated by those skilled in the art it is generally desirable to utilize as few layers as possible to accomplish a desired result, reducing the process steps necessary to produce the device, and thereby providing a much simpler and more robust manufacturing process. Moreover, utilizing as few layers as possible also results in higher yields as it is simpler to control the stoichiometric composition and dimensions of the fewer layers.

It will further be appreciated that although shown and described as part of a silicon-oxide-oxynitride-oxide-silicon stack in a memory device, the structure and method of the present disclosure is not so limited, and the silicon-oxide-oxynitride-oxide-silicon structure can be used in or with any semiconductor technology or in any device requiring a charge storing or dielectric layer or stack including, for example, in a split gate flash memory, a TaNOS stack, in a 1T (transistor) SONOS-type cell, a 2T SONOS-type cell, a 3T SONOS-type cell, a localized 2-bit cell, a multilevel programming or cell, and/or a 9T or 12T non-volatile semiconductor memory (NVSM) cells without departing from the scope of the disclosure. FIGS. 8A-8E are schematic diagrams of exemplary memory cell architectures for which the multi-layer charge storing layer of the present disclosure is particularly useful.

The advantages of the structures and methods of forming the same according to an embodiment of the present disclosure over previous or conventional approaches include: (i) the ability to enhance data retention in memory devices using the structure by dividing the oxynitride layer into a plurality of films or layers and tailoring the oxygen, nitrogen and silicon profile across each layer; (ii) the ability to enhance speed of a memory device without compromising data retention; (iii) the ability to meet or exceed data retention and speed specifications for memory devices using a silicon-oxide-oxynitride-oxide-silicon structure of an embodiment of the present disclosure at a temperature of at least about 125° C.; and (iv) provide heavy duty program erase cycles of 100,000 cycles or more.

Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

In the forgoing description, for purposes of explanation, numerous specific details have been set forth in order to provide a thorough understanding of the multi-layer charge storing layer and method of the present disclosure. It will be evident however to one skilled in the art that the present interface device and method may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the hot de-latch system or method. The appearances of the phrase "one embodiment" in various places in the specification do not necessarily all refer to the same embodiment. The term "to couple" as used herein may include both to directly electrically connect two or more components or elements and to indirectly connect through one or more intervening components.

What is claimed is:

1. A method of forming a semiconductor device, comprising:
   forming a tunnel oxide layer on a silicon containing layer of a substrate;
   forming a multi-layer charge storing layer by:
   depositing on the tunnel oxide layer a first charge storing layer comprising an oxygen-rich oxynitride in which a stoichiometric composition of the oxygen-rich oxynitride results in the first charge storing layer being substantially trap free; and
   depositing directly on the first charge storing layer a second charge storing layer comprising an oxygen-lean, silicon-rich and nitrogen-rich oxynitride layer in which a stoichiometric composition of the oxygen-lean, silicon-rich and nitrogen-rich oxynitride layer results in it being trap dense, and wherein the second charge storing layer further comprises a concentration of carbon selected to increase a number of traps therein;
   forming a blocking oxide layer on the second oxynitride layer; and
   forming a silicon containing gate layer on the blocking oxide layer.

2. The method of claim 1, wherein the stoichiometric composition of the first charge storing layer comprises a concentration of oxygen selected to increase a retention performance of the multi-layer charge storing layer by acting as a barrier between charge trapped in the second charge storing layer and the substrate.

3. The method of claim 2, wherein the concentration of oxygen in the first charge storing layer is about 15 to about 40%.

4. The method of claim 2, wherein the concentration of oxygen in the first charge storing layer is about 35%.

5. The method of claim 2, wherein the concentration of oxygen in the second charge storing layer is less than about 5%.

6. The method of claim 2, wherein the retention performance of the multi-layer charge storing layer increases an end-of-life (EOL) for the semiconductor device at a specified difference between program and erase voltages to at least about 20 years.

7. The method of claim 1, wherein the second charge storing layer comprises a charge trap density at least 1000 times greater than the first charge storing layer.

8. The method of claim 1, wherein the first charge storing layer is formed in a chemical vapor deposition (CVD) process using a process gas comprising a dichlorosilane ($SiH_2Cl_2$)/ammonia ($NH_3$) mixture at a ratio in a range of about 5:1 to 15:1 and a nitrous oxide ($N_2O$)/$NH_3$ mixture at a ratio in a range of about 2:1 to 4:1, and wherein the second charge storing layer is formed in a CVD process using a process gas comprising a $N_2O$/$NH_3$ mixture at a ratio in a range of about 1:6 to 1:8 and a $SiH_2Cl_2$/$NH_3$ mixture at a ratio in a range of about 1.5:1 to 3:1.

9. The method of claim 8, wherein forming the first charge storing layer and the second charge storing layer are performed sequentially in a single CVD tool by changing the ratio of the $N_2O$/$NH_3$ and $SiH_2Cl_2$/$NH_3$ mixtures.

10. The method of claim 1, wherein the tunnel oxide layer is grown in an ISSG (In-Situ Steam Generation) chamber with a radical oxidation using a reaction between oxygen ($O_2$) and hydrogen ($H_2$) on the substrate at temperatures of at least 1000° C.

11. The method of claim 1, wherein the blocking oxide layer is formed by high density plasma (HDP) oxidation of a portion of the second oxynitride layer.

12. The method of claim 1, wherein the second charge storing layer is formed in a CVD process using a process gas comprising Bis-TertiaryButylAminoSilane (BTBAS) and ammonia ($NH_3$) mixed at a ratio of from about 7:1 to about 1:7.

13. A multi-layer charge storing layer comprising:
   a first charge storing layer comprising an oxygen-rich oxynitride in which a stoichiometric composition of the oxygen-rich oxynitride results in the first charge storing layer being substantially trap free; and
   a second charge storing layer directly on the first charge storing layer comprising an oxygen-lean, silicon-rich and nitrogen-rich oxynitride in which a stoichiometric composition of the oxygen-lean, silicon-rich and nitrogen-rich oxynitride layer results in it being trap dense,
   wherein the second charge storing layer further comprises a concentration of carbon selected to increase a number of traps therein.

14. The multi-layer charge storing layer of claim 13, wherein the first charge storing layer comprises a homogeneous composition.

15. The multi-layer charge storing layer of claim 13, wherein the second charge storing layer comprises a concentration of carbon of from about 5% to about 15%.

16. The multi-layer charge storing layer of claim 13, wherein a concentration of oxygen in the first charge storing layer is from about 15% to about 40%.

17. The multi-layer charge storing layer of claim 16, wherein a concentration of oxygen in the second charge storing layer is less than about 5%.

18. The multi-layer charge storing layer of claim 13, wherein the second charge storing layer comprises a charge trap density at least 1000 times greater than the first charge storing layer.

* * * * *